United States Patent [19]

Schultz

[11] 3,936,120

[45] Feb. 3, 1976

[54] ANTENNA CONNECTOR

[75] Inventor: Ronald L. Schultz, Northfield, Ill.

[73] Assignee: Chromalloy-Alcon, Inc., Chicago, Ill.

[22] Filed: July 26, 1974

[21] Appl. No.: 492,242

[52] U.S. Cl.......... 339/17 M; 339/126 J; 339/217 J

[51] Int. Cl.²... H05K 1/00; H02B 1/02; H01R 9/08

[58] Field of Search.. 339/17 R, 17 C, 17 L, 17 LC, 339/17 LM, 17 M, 14, 18, 182 R, 183, 177 R, 177 E, 217 R, 217 J, 217 S

[56] References Cited

UNITED STATES PATENTS

| | | | |
|---|---|---|---|
| 2,762,024 | 9/1956 | Heath | 339/14 R X |
| 3,218,606 | 11/1965 | Schultz | 339/17 M X |
| 3,783,321 | 1/1974 | Patterson | 339/17 R X |

FOREIGN PATENTS OR APPLICATIONS

| | | | |
|---|---|---|---|
| 70,102 | 2/1959 | France | 339/18 C |

*Primary Examiner*—Joseph H. McGlynn
*Assistant Examiner*—Craig R. Feinberg
*Attorney, Agent, or Firm*—Hill, Gross, Simpson, Van Santen, Steadman, Chiara & Simpson

[57] ABSTRACT

An electrical connector especially suitable for coupling an antenna leadin with a printed circuit board in a receiver chassis comprises a tubular sheet metal body formed from an originally flat blank and with confronting edges along a longitudinal joint. Opposite ends of the body have means for connecting it in functioning position. One end of the body provides a plug-receiving socket. A dielectric support located within the body spaced from the socket end carries an electrical contact for engagement by a plug inserted into the socket. Means connecting the dielectric support and the body together include a mechanical interlock retaining the body against spreading open at the joint in the vacinity of the support. A plurality of forms of the interlock are provided. A method of making the connector is disclosed.

19 Claims, 10 Drawing Figures

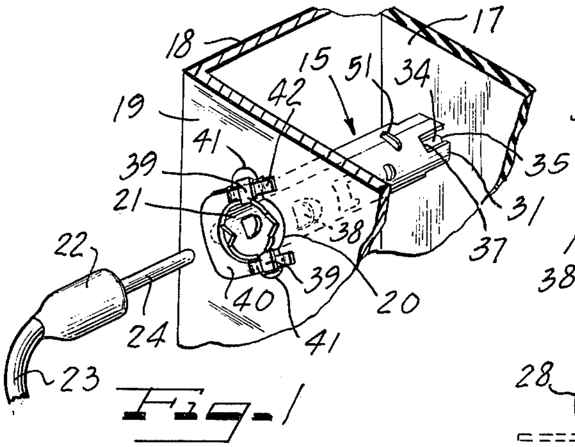
Fig. 1
Fig. 2
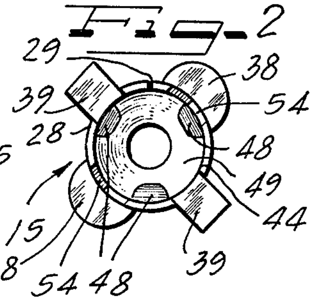
Fig. 3
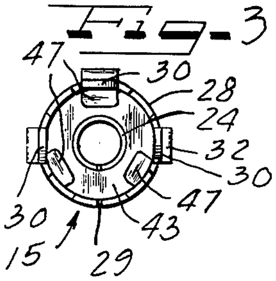
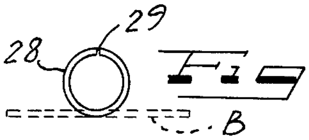
Fig. 4
Fig. 6
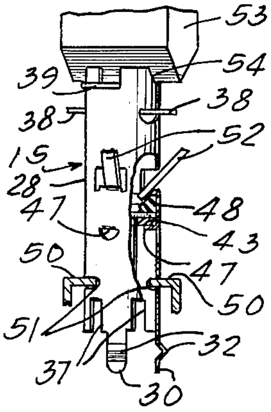
Fig. 5
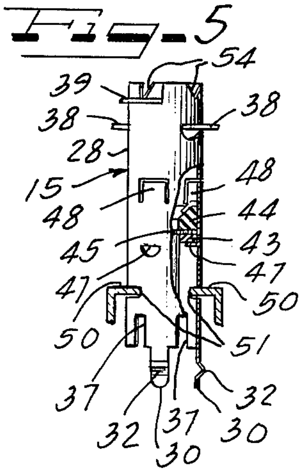
Fig. 7
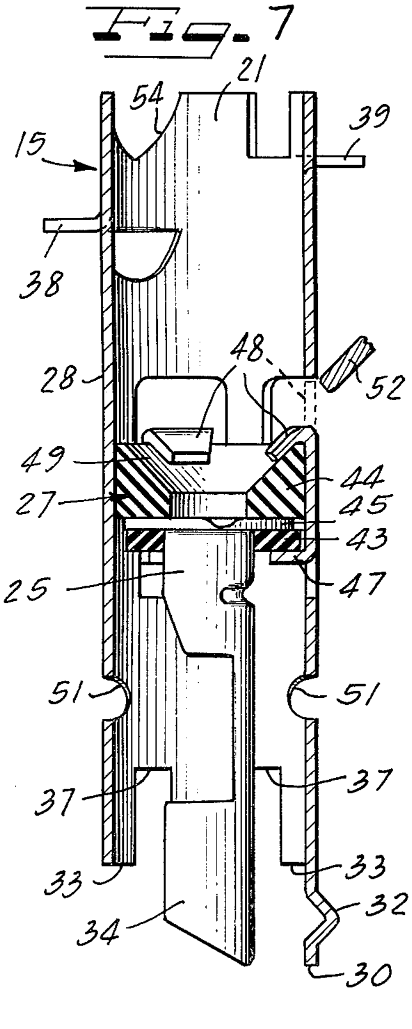
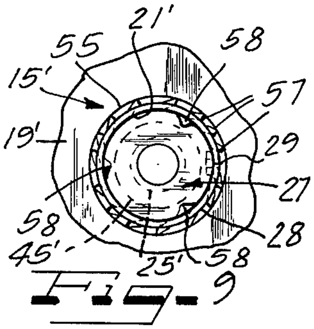
Fig. 9
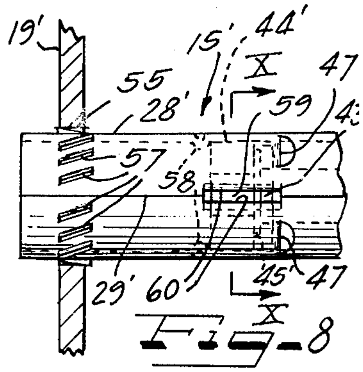
Fig. 8
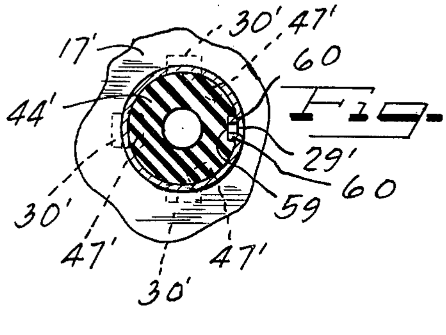
Fig. 10

ANTENNA CONNECTOR

This invention relates to electrical connectors and is more particularly concerned with such connectors especially suitable for coupling antenna leadins with printed circuit boards in receiver chassis.

Electrical tubular connectors have customarily been made as seamless members from tubular stock or as drawn shells. Where the connectors provide female sockets to receive plugs, a substantial problem has existed in properly sizing the sockets to receive the plugs freely but with sufficient frictional engagement to assure retention. An example of such connectors are those employed for coupling an antenna leadin by means of a plug attached to the leadin which is inserted into the socket of a connector supported by a receiver chassis and connected to a printed circuit board. As heretofore constructed, it has been necessary to mount the tubular connectors first in position on the chassis; and then effect connection with the printed circuit board. This has involved a time consuming assembly operation during bench assembly of instruments, and has complicated repairs when required.

An important object of the present invention is to overcome the disadvantages, deficiencies, inefficiencies, shortcomings and problems in prior electrical connectors of the type indicated and to provide a new and improved structure and method of making that structure.

Another object of the invention is to provide a new and improved electrical connector especially suitable for coupling an antenna leadin with a printed circuit board.

Still another object of the invention is to provide a new and improved electrical connector which can be economically made from sheet metal.

Yet another object of the invention is to provide a new and improved electrical connector which can be solder connected to a printed circuit board before installation in a receiver chassis.

A still further object of the invention is to provide an electrical connector with new and improved means for releasable connection with a supporting panel.

Other objects, features and advantages of the invention will be readily apparent from the following description of certain preferred embodiments thereof, taken in conjunction with the accompanying drawing although variations and modifications may be effected without departing from the spirit and scope of the novel concepts embodied in the disclosure, and in which:

FIG. 1 is a fragmentary isometric view showing an electrical connector embodying features of the present invention in its functioning position;

FIG. 2 is a front end view of the electrical connector;

FIG. 3 is a rear end view of the electrical connector;

FIG. 4 is a schematic view showing how the electrical connector is formed up from flat sheet metal;

FIG. 5 is a side elevational view, partially broken away, of the electrical connector showing it in an intermediate stage of manufacture;

FIG. 6 is a similar side elevational view showing the connector in a final stage of manufacture;

FIG. 7 is an enlarged diametrical vertical sectional detail view through the electrical connector;

FIG. 8 is a fragmentary side elevational view of a modified form of the connector;

FIG. 9 is a front end view of the connector of FIG. 8; and

FIG. 10 is a sectional detail view taken substantially along the line X—X of FIG. 8.

In FIG. 1, a representative installation of a connector 15 embodying features of the invention has been depicted, and comprising a printed circuit board 17 located within a receiver chassis 18 including a mounting element 19 which for convenience herein will be referred to as a panel. One end of connector 15 is constructed and arranged to be mounted on and in association with the board 17 in permanent, unitary relation wherewith so that the connector can be bench assembled with the board as a modular unit. At its opposite end, the connector 15 is constructed and arranged to be mounted on and in association with the chassis panel 19 by assembling such end through an opening 20 in the panel. As thus mounted, the connector 15 provides a socket 21 within which is adapted to be received an antenna lead-in plug 22 attached to a lead-in conductor 23 such as a coaxial cable. Within the socket 21, the outer shell of the plug 22 makes a grounding connection with the connector 15 and through the connector with the chassis 18, and a central finger extension 24 of the plug is received in a tubular contact 25 (FIG. 7) carried by a dielectric support 27 located within the body of the connector 15 spaced from the socket end and supporting the contact 25 insulated from the shell of the connector.

According to the present invention the connector 15 is formed up from an initially flat blank B (FIG. 4) of suitable sheet metal bent into a tubular body 28 with longitudinal edges confronting in a longitudinal joint 29. Thereby, all of various integral appurtenant features of the tubular connector shell can be easily and economically formed by progressive die sheet metal manufacturing techniques, eliminating any need for deep drawing dies, or for costly devices to process seamless tubing pieces.

At one end which may be termed the base end, the tubular body 28 is provided with means for retention in assembly with the printed circuit board 17. This comprises a plurality, such as three, generally axially extending, circumferentially spaced, resilient, snap-in tabs, fingers or lugs 30 (FIGS. 3 and 5–7) which are engageable through suitable slots 31 in the board 17 to engage respective shoulders 32 of the lugs against a back face of the board 17 and draw axially facing shoulders 33 on the end of the body 28 adjacently spaced from the lugs firmly against the front face of the board 17. As will be observed in FIG. 7, the tubular contact 25 has a terminal 34 which extends sufficiently beyond the shoulders 33 to project through a suitable opening 35 in the board 17 to enable soldered connection of the terminal with suitable printed circuit lead (not shown) on the back face of the board 17. One or more of the lugs 32 may be soldered to one or more grounding leads. In order to facilitate dip soldering connection of the printed circuit leads to the appropriate parts of the connector 15, the board-connected end of the body 28 is provided with flux drain slots or notches 37 opening endwise adjacent to and between the lugs 32. The openings defined by the notches 37 also serve a useful function in avoiding moisture accumulation in service within the tubular body 28 of the connector.

At its opposite, forward socket end, the connector body 28 is provided with means for mounting it in functioning position with respect to the chassis panel 19. For this purpose, a pair of diametrically opposite ear-like integral shoulder lugs 38 (FIGS. 1, 2 and 4-7) are struck from the body 28 and project laterally from the body to engage against the inner side of the panel 19. At right angles to the mounting lugs 38, a pair of diametrically opposite laterally outwardly projecting locking lugs 39 are struck integrally from the body 28 in outwardly spaced relation relative to the plane of the lugs 38 sufficient to accomodate the thickness of the panel 19 plus a locking device comprising a wedging fastener in the form of a forked warped spring washer or grounding and coupling clip 40. Through this arrangement, after the socket end portion of the connector body 28 has been inserted through the panel opening 20, with the locking lugs 39 freely passing through respective lateral clearance elongations 41 at diametrically opposite sides of the opening 20 in the panel 19, the locking clip 40 is moved into position as a yoke about the body 28 and in electricl contact between the panel 19 and the locking lugs 39. As soon as the hump spring locking fingers 42 of the locking clip 40 bridge across the hole elongations 41 and lock the lugs 39 against retraction, the connector 15 is locked in place on the panel 19 and firmly retained against axial inward displacement when the plug 22 is plugged into the connector socket 21. The lugs 38 resist outward displacement when the plug 22 is withdrawn from the socket 21.

New and improved means are provided for connecting the dielectric support 27 and the body 28 together, including a mechanical interlock retaining the body against spreading open at the joint 29. In this instance, the dielectric support 27 comprises a relatively thin dielectric backwasher 43 and a thicker front washer 44 between which a head flange 45 of the tubular contact 25 is clamped. At least the front washer 44 is of a diameter complementary to the inside diameter of the body 28. Positioning of the dielectric support and contact assembly intermediate the length of the body 28 and suitably spaced from its socket end is effected by means of a plurality, herein three inwardly struck integral equidistantly circumferentially spaced lugs 47 on the body against which the washer 43 engages. At the opposite end of the assembly a plurality, herein three, circumferentially equidistantly spaced integral mechanical interlock lugs 48 are struck inwardly from the body 28 into engagement with the outer washer 44 and thereby clamp the support and contact assembly firmly in place.

In addition to their function as securing lugs for the support 27, the lugs 48 function in cooperation with the outer washer 44 to retain the body 28 against spreading open about the support 27, and, in fact, serve to draw and hold the body 28 tightly about the support 27, and especially the thicker washer 44. For this purpose, the outer end of the washer 44 is provided with a recess 49 in the form of a frustoconically tapered counterbore leading to the entrance into the contact 25. The contacts 48 are bent into gripping interlock relation over the lip defining the outer end of the counterbore and engage within the counterbore to effect a thorough gripping retention with the washer 44. Although the annular area of the body 28 about the support 27 is firmly held against spreading open at the joint 29, the section of the length of the connector body 28 providing the socket 21 can yield slightly diametrically when the plug 22 is inserted. Thereby, by having a slight differential undersize of the inside diameter of the body 28 relative to the outside diameter of the plug 22, assurance of thorough frictional retention of the plug 22 within the socket is provided and positive electrical grounding contact maintained between the shell of the plug and the tube wall of the connector body 28 which is in thoroughly grounded mounted connection with the chassis panel 19 through the lugs 38 and 39 and the clip 40.

In making the connector 15, the clamping and gripping lugs 48 are initially merely partially separated from the material of the tubular body 28, as shown in full line in FIG. 5 and in phantom outline in FIG. 7, whereby the lugs 48 remain in the wall plane of the body 28 when it is formed up from the blank B into the tubular form represented in FIG. 4. In other respects all of the features of the body 28 are complete and ready for installation. Completion of the connector 15 is then effected by assembling the contact 25 and the support 27 within the body 28 on the preformed lugs 47 and finally mechanically interlocking the support 27 and the body 28 by bending the lugs 48 inwardly and into gripping, clamping and interlocking engagement with the washer 44. For this purpose, the body 28 is engaged on rails 50 (FIGS. 5 and 6) which are received in diametrically opposite, parallel, transverse rail slots 51 provided for this purpose in the base end portion of the body 28. As the body 28 rides along the rails 50, the contact 25 and the dielectric support 27 as an assembly are inserted into the body 28 through the socket end thereof and into position on the shoulder lugs 47. The assembly is then completed while the body 28 is still on the rails 50 by driving respective bending punches 52 from suitable clearance relation to the body 28 in converging oblique relation toward and against the lugs 48, as shown in FIGS. 6 and 7, to drive the lugs 48 inwardly onto the washer 44 and into interlocking relation within the recess provided by counterbore 49. In order to maintain the body 28 accurately oriented with the lug upsetting punches 52 and to stabilize the body 28 on the rails 50 during operation of the punches, means comprising a wedge shaped crown-engaging bar 53 engages with the socket or crown end of the shell of the body 28 within respective wedge shaped diametrically opposite outwardly opening notches 54 provided for this purpose in the body. Thus while the body 28 is firmly held by and between the rails 50 and the stabilizing bar 53, the lugs 48 are upset by the punches 52 and into the retaining, clamping interlocking engagement with the washer 44. After this operation, the connector 15 may be plated if desired or otherwise finished and is ready for assembly with the printed circuit board 17 which may be effected as a bench assembly procedure, whereafter the connector 15 and the printed circuit board 17 as a modular unit may be mounted in the chassis 18, and more particularly with the socket end of the connector assembled with and secured in place in the panel 19, as has already been described.

In a modified and somewhat simpler construction, a connector 15′ (FIGS. 8–10) includes a tubular, elongated shell body 28′ formed up from a flat sheet metal blank similarly as described for the connector 15. At one end, the body 28′ is provided with means for mounting it on and in association with a printed circuit board 17′ and including shoulder tabs or lugs 30′, similar to the corresponding spring finger shoulder mounting lugs 30 of the connector 15.

Instead of a system of mounting and retaining lugs, means are provided on the head or socket end of the body 28′ for reception through and within a cylindrical hole 55 in a chassis panel 19′ for effecting grounding electrical connection with the panel. For this purpose, the body 28′ is provided with an annular series of a plurality of circumferentially spaced helically oriented narrow biting vanes 57 struck integrally by partial separation from the body 28′ and projecting generally radially outwardly from the body to a diameter about the same as the diameter of the hole 55. Through this arrangement, after the connector 15′ has been mounted by the printed circuit board 17′, the connector is adapted to be placed in mounted relation to the chassis panel 19′ by projecting the socket end portion of the connector through the hole 55 until the series of vanes 57 are aligned with their outer edges contiguous to the surface defining the hole 55. Contiguity of the vane edges to the hole surface may be frictional engagement, but may be a fairly easy sliding fit for ease in assembly. By having the area of the socket 21′ of the connector body 28′ slightly undersize in diameter relative to the outside diameter of the shell of a plug to be received therein, when the plug is inserted into the socket, spreading of the socket area along the longitudinal split joint 29′ causes the vanes 57 to be spread into firm biting engagement with the wall defining the hole 55. This biting interengagement results in making excellent grounding electrical contact with the chassis panel 19′, but also effects a firm anchorage of the body 28′ against shifting longitudinally when the plug is inserted into the socket of the connector 15′ but also when the plug is withdrawn from the socket. Such resistance to longitudinal displacement of the connector 15′ is substantially enhanced by the generally helical disposition of the biting vanes 57 since the opposite or base end of the connector 15′ is held by its mounting on the board 17′ firmly against any torsional displacement. By having the vanes 57 slightly inclined from a true radius, they can yield slightly resiliently as the socket is expanded when a plug is inserted therein, so that binding of the plug is avoided while nevertheless the plug is quite firmly frictionally gripped by the socket portion of the body 28′ for excellent electrical grounding contact.

Mounting of the tubular contact 25′ with its lateral head flange 45′ stacked and clamped between the back dielectric washer 43′ and the front thicker dielectric washer 44′ of the dielectric support 27 is effected within the tubular housing 28′ in the same manner as described for the connector 15, namely, by inserting the assembly through the socket end of the connector 15′ and supporting the backwasher 43′ on inturned shoulder lugs 47′. In this instance the dielectric support 27′ is secured in place by means of a circumferential series such as three indents 58 which engage the outer corner of the thicker washer 44′ and retain it in clamping engagement with the flange 45′ and the backwasher 43′ and against the shoulder lugs 47′.

For mechanically interlocking the dielectric support 27′ and the body 28′ to retain the body against spreading open at the joint 29′ in the area of the support 27′, the washer stack 43′, 44′ is provided in its outer perimeter with a longitudinally extending recess slot 59, and the body 28′ is provided with a pair of inturned interlock lugs 60 which extend into the recess 59 and engage the longitudinal radially extending walls defining the recess to retain the body 28′ tightly, wrappingly, snuggly engaged with the dielectric support 27′. It will be understood that as initially constructed, and before the dielectric support and contact assembly has been inserted into the tube of the body 28′, the interlock lugs 60 lie flush within the tubular plane of the body 28′ so as to avoid any interference with the assembling operation. After the washer and contact stack has been secured within the body 28′, the interlock lugs 60 are bendably upset by suitable tool into the recess 59 and into interlocking engagement with the dielectric support 27′ within the recess. In this arrangement, as in the arrangement of the connector 15, a substantial length of the connector beyond the interlock connection to the socket end of the connector is free to expand slightly as permitted by the joint 29′ when a plug is inserted into the socket. On such occurrence, the vanes 57 assure that expansion of the socket area of the body 28′ will be uniform and that the joint 29′ will expand only slightly, so that there is no liability of the interlock lugs 60 working out of interlocking engagement with the wall surfaces within the slot 59.

In both forms of the invention disclosed, maintaining the joint in the tubular housing shell body as tight as practicable about the dielectric contact mount or support and from there to the base of the connector which surrounds the contact, assures continuity of shielding, that is shielding integrity from the coaxial cable to the radio frequency stage of the amplifier.

It will be understood that variations and modifications may be effected without departing from the spirit and scope of the novel concepts of this invention.

I claim as my invention

1. An electrical connector especially suitable for coupling an antenna leadin with a printed circuit board and a receiver chassis, comprising:

a tubular sheet metal body formed from an originally flat blank and having confronting edges along a longitudinal joint;

means at opposite ends of the body for mounting it in functioning position;

said body providing a plug-receiving socket opening through one of said ends;

a dielectric support located within said body spaced from said one end and carrying an electrical contact insulated from said body; and means connecting the support and the body together including a mechanical interlock retaining the body against spreading open at said joint in the vicinity of said support.

2. A connector according to claim 1, wherein said mechanical interlock comprises a recess in said support and interlock lug means engaging the support in the recess.

3. A connector according to claim 2, wherein said recess is of generally frustoconical form at one end of said support, and said interlock lug means comprise a plurality of circumferentially spaced lugs partially struck from the sheet metal body and bent into engagement with the support in the frustoconical recess.

4. A connector according to claim 2, wherein said recess extends longitudinally in the perimeter of the support, and said interlock lug means comprise a plurality of lugs bent from the body into said recess.

5. A connector according to claim 1, wherein said joint from said support to said one end is slightly expansible to permit slight expansion yielding of the socket on insertion of an antenna lead-in plug thereinto.

6. A connector according to claim 5, including an annular series of radially outwardly projecting integrally struck out biting vanes on said body adjacent to said one end and engageable in electrically contacting relation with the surface defining a hole in a chassis opening and also serving to limit expansion of the socket.

7. A connector according to claim 1, including a pair of laterally extending engagement lugs adjacent to said one end for engagement with one side of a chassis panel and a second pair of engagement lugs spaced from the first mentioned lugs toward said one end, and a fastening clip engageable with said second pair of lugs for grounding and coupling of the connector to a chassis panel.

8. A connector according to claim 1, including a pair of parallel diametrically opposite transverse slots adjacent to the opposite of said ends for engagement therein of rails to facilitate handling of the body for assembly of the support therein for completing the mechanical interlock.

9. A connector according to claim 1, including attachment lugs on the opposite end of the body for engagement with the printed circuit board, shoulders adjacent to the lugs for engaging the circuit board, and notches provided in the body adjacent to said shoulders to facilitate drainage from within the body.

10. A connector according to claim 1, in combination with the printed circuit board and a mounting panel of the receiver chassis, the end of said body opposite to said one end fixedly secured to the circuit board, said panel having an opening therethrough for said body, said one end inserted through said opening, and said mounting means at said one end effecting electrically grounded connection with said panel.

11. A combination according to claim 10, wherein said mounting means comprise a pair of lugs engaging one side of the panel, a pair of lugs spaced from said panel engaging lugs slightly greater than the thickness of the panel, the panel having extensions of said opening to clear said spaced lugs therethrough, and retaining clip means engaging the panel across said extensions and engaging said spaced lugs to retain the body in position relative to the panel.

12. A combination according to claim 10, wherein said opening is circular, and said mounting means comprise an annular series of vanes having biting edges engaging the panel within the opening.

13. An electrical connector in combination with a printed circuit board and a receiver chassis and suitable for coupling an antenna leadin with the printed circuit board, comprising:

the connector having a tubular sheet metal body provided at one end with means connecting it to the printed circuit board;

the opposite end of the body providing a plug-receiving socket;

said panel having an opening to receive said opposite end of the body therethrough;

means on said opposite end of the body for mounting the body on the panel by assembling said opposite end through said opening;

said mounting means comprising first lug structure partially struck from said body and projecting laterally therefrom and engaging the backside of the panel adjacent to said opening;

second lug means on said body spaced from said first lug means and from the plane of a front side of the panel; and retaining clip means between said second lug means and said panel front side for maintaining the connector in mounted relation to the panel.

14. An electrical connector especially suitable for coupling an antenna leadin with a printed circuit board and a receiver chassis, comprising:

a tubular sheet metal body formed from an originally flat blank and having confronting edges along a longitudinal joint;

said body having means at one end for connection with a printed circuit board;

the opposite end of said body providing a plug-receiving socket and having means for mounting the body on a chassis panel by assembling said opposite end through an opening in the panel after said one end has been permanently connected to the board;

a member located within said body; and means connecting said member and said body together including a mechanical interlock retaining the body against spreading open at said joint.

15. A connector according to claim 14, in combination with the printed circuit board and a mounting panel of the receiver chassis, said one end of the body fixedly secured to the circuit board by said connection means at said one end, said mounting panel having an opening therethrough and said opposite end of the body received in said opening, and said mounting means effecting electrically grounded connection with said panel.

16. A combination according to claim 15, wherein said mounting means comprise a pair of lugs engaging one side of the panel, a pair of lugs spaced from said panel engaging lugs slightly greater than the thickness of the panel, the panel having extensions of said opening to clear said spaced lugs therethrough, and retaining clip means engaging the panel across said extensions and engaging said spaced lugs to retain the body in position relative to the panel.

17. A combination according to claim 15, wherein said opening is circular, and said mounting means comprise an annular series of vanes having biting edges engaging the panel within the opening.

18. A connector according to claim 14, wherein said mounting means comprise an annular series of circumferentially spaced vanes having biting edges for engagement with a surface defining the opening in the panel.

19. A connector according to claim 18, said vanes extending in generally helical relation to the axis of the body to resist axial displacement of the body relative to the panel.

* * * * *